(12) United States Patent
Marchand

(10) Patent No.: US 7,813,128 B2
(45) Date of Patent: Oct. 12, 2010

(54) METHOD FOR COOLING A STATIC ELECTRONIC POWER CONVERTER DEVICE AND CORRESPONDING DEVICE

(75) Inventor: Roger Marchand, Montpellier (FR)

(73) Assignee: Intelligent Electronic Systems (IES), Montpellier (FR)

( * ) Notice: Subject to any disclaimer, the term of this patent is extended or adjusted under 35 U.S.C. 154(b) by 630 days.

(21) Appl. No.: 11/814,217

(22) PCT Filed: Nov. 29, 2005

(86) PCT No.: PCT/FR2005/002958

§ 371 (c)(1),
(2), (4) Date: Jul. 18, 2007

(87) PCT Pub. No.: WO2006/077288

PCT Pub. Date: Jul. 27, 2006

(65) Prior Publication Data

US 2010/0039771 A1 Feb. 18, 2010

Related U.S. Application Data

(60) Provisional application No. 60/650,794, filed on Feb. 8, 2005.

(30) Foreign Application Priority Data

Jan. 19, 2005 (FR) .................................. 05 00528

(51) Int. Cl.
*H05K 7/20* (2006.01)

(52) U.S. Cl. ...................... 361/694; 361/695; 361/703; 361/715

(58) Field of Classification Search ....................... None
See application file for complete search history.

(56) References Cited

U.S. PATENT DOCUMENTS 4,525,769 A * 6/1985 Lehmann ..................... 361/704
4,639,834 A * 1/1987 Mayer ......................... 361/710

(Continued)

FOREIGN PATENT DOCUMENTS

DE 33 47 854 A 6/1985
WO WO00/27176 A 5/2000

*Primary Examiner*—Gregory D Thompson
(74) *Attorney, Agent, or Firm*—Lucas & Mercanti, LLP

(57) ABSTRACT

The present invention relates to a method of cooling a static electronic power converter device including at least one electrical circuit including an assembly of active components and of passive components mounted in a closed radiator housing from which only the inlet and the outlet of the circuit communicate with the outside of the housing, in which the distribution of the heat energy given off by the active and passive components is made uniform throughout the inside volume of the housing, and the heat energy is transferred from the radiator housing by forced convection in substantially uniform manner over the entire inside surface of the walls of the housing by causing at least one fluid contained inside the leaktight housing to circulate in a closed circuit. The invention also provides a static electronic power converter device enabling the method to be implemented.

9 Claims, 4 Drawing Sheets

U.S. PATENT DOCUMENTS

| | | | | |
|---|---|---|---|---|
| 4,872,102 A | * | 10/1989 | Getter | 363/141 |
| 5,065,278 A | * | 11/1991 | Schultz | 361/688 |
| 5,185,691 A | * | 2/1993 | Korinsky | 361/720 |
| 5,373,418 A | * | 12/1994 | Hayasi | 361/707 |
| 5,742,478 A | * | 4/1998 | Wu | 361/704 |
| 6,046,908 A | * | 4/2000 | Feng | 361/707 |
| 6,081,425 A | * | 6/2000 | Cheng | 361/704 |
| 6,144,556 A | * | 11/2000 | Lanclos | 361/695 |
| 6,535,409 B2 | * | 3/2003 | Karol | 363/141 |
| 2002/0118509 A1 | | 8/2002 | Yamashita et al. | |

* cited by examiner

METHOD FOR COOLING A STATIC ELECTRONIC POWER CONVERTER DEVICE AND CORRESPONDING DEVICE

FIELD OF THE INVENTION

The present invention relates to a method of cooling a static electricity converter device and to a corresponding static converter device using the cooling method.

The technical field of the invention is that of designing and fabricating electronic power systems, in particular electricity converters installed in optionally permanent manner in larger mechanical and/or electrical units where they participate in the operation thereof.

Such electricity converter devices apply in particular to on-board battery chargers for electrically powering electric vehicles such as goods transport carriages, elevator pods, or indeed small transport vehicles such as golf carts.

Static converters of the above-described type, e.g. on-board battery chargers, comprise electronic circuits made up of various active electrical components (MOS transistors, diodes) and passive components (transformers, capacitors, inductors, resistors) placed inside metal protective housings. When the converters are in operation, said components heat up on conveying electric current, causing their temperatures to rise sometimes by as much as several tens of degrees Celsius, and that can lead to said components being destroyed.

DESCRIPTION OF THE PRIOR ART

At present, the on-board converters in use, an example of which is shown in FIG. 1, are cooled by forced ventilation using a fan. The housing 1 is open at two locations in its long direction, enabling "cool" air A to be introduced at a first end, enabling the air to flow through the housing and pick up the heat energy given off by the electrical components therein, with the "hot" air C being exhausted through the other open end of the housing.

Such a method of cooling is entirely satisfactory in terms of operation and energy efficiency. Nevertheless, certain drawbacks remain in terms of protecting the electronic circuits of converters due to the existence of the air flow openings needed for cooling their components. These openings encourage dust and other solid or liquid particles to penetrate into the housing, which particles become deposited on the electronic circuit inside the housing of such a converter. Given the ever more severe conditions of use and maintenance to which vehicles with such on-board converters are being subjected (projections of sand, mud, or water, cleaning with a high pressure hose), the manufacturers and the users of such vehicles are finding an ever greater need for converters that are completely leaktight with respect to dust and projections of a variety of solid or liquid materials that damage and even destroy present converters that are open to the outside and cooled by forced ventilation (FIG. 1).

SUMMARY OF THE INVENTION

In parallel, said manufacturers and users of electric vehicles require such leaktight converters to be provided at a price that is substantially equivalent to that of converters cooled by forced convection, which means that it is not possible to envisage using expensive technical solutions for making leaktight static electronic power converters that satisfy their requirements, e.g. solutions known in the aviation industry.

The present invention seeks to remedy the drawbacks of known static electronic power converters by proposing a novel method of cooling that enables said converters to be made leaktight.

Another object of the present invention is to provide a leaktight static electronic power converter that uses the cooling method of the invention, and that is of a structure that presents modifications that are only minor compared with present converters, and that are of a cost price that is consequently equivalent.

In a first aspect, the present invention satisfies these objects by providing a method of cooling a static electronic power converter device comprising at least one electrical circuit comprising an assembly of active components and of passive components interconnected in a manner suitable for performing a determined electrical energy conversion function, said circuit including means for inputting electricity that is to be converted and means for outputting converted electricity and being mounted in a closed radiator housing with only said inlet and outlet means of said circuit communicating between the inside of the housing and the outside, the method being characterized in that the distribution of heat energy given off by said active and passive components is made uniform throughout the inside volume of said housing and said heat energy is transferred from said radiator housing by forced convection in substantially uniform manner over the entire inside surface of the walls of said housing, by causing at least one fluid contained inside said leaktight housing to circulate in a closed circuit.

By making the distribution of heat inside the housing of the converter uniform, the method of the invention serves advantageously to eliminate hot spots on the surface of the converter housing, and thus to diminish the thermal resistance between the components and the housing sufficiently to transmit the heat energy from the electronic components to the housing and thus dispose of it. Surprisingly, it has been found that convection via a fluid in contact with the components for cooling and the walls of the housing suffices to remove the heat energy given off by the components while the converter is in operation. The fluid in forced circulation inside the housing thus acts as a uniform heat exchanger between the housing and the components, in particular the passive components.

As a result, it is possible to make a converter that is closed in a manner that is leaktight against liquid or solid particles around the electronic circuits of the converter.

According to a preferred characteristic of the method of the invention, said fluid is channeled relative to said active or passive components and to said inside walls of the housing. This serves to guide the fluid around all of the components or only some of them, and also to prevent the fluid stagnating in certain corners of the housing, thereby further improving the uniform distribution of heat from the components inside the housing.

In accordance with another preferred characteristic, the speed at which the fluid circulates inside the housing is caused to vary as a function of the amount of heat energy given off by said components and/or as a function of the inside volume of said radiator housing. By varying the speed of the fluid inside the housing, it is possible to control heat transfer so as to comply with safety standards concerning the operation of converters, which standards specify limiting temperature values for the housing.

In the simplest configuration, the radiator housing defines a single closed compartment around the electronics of the converter device. Nevertheless, in a particular and advantageous implementation of the method of the invention, it is sometimes preferable to cause said fluid to circulate between at least two compartments that are defined inside said housing.

According to another advantageous characteristic of the method of the invention, a fluid pressure difference is established between said compartments so as to encourage fluid circulation inside the housing and increase the transfer of heat energy to the walls of said housing.

In another aspect, the invention provides a static electronic power converter device comprising at least one electrical circuit comprising an assembly of active components and of passive components interconnected in a manner suitable for performing a determined electrical energy conversion function, said circuit having inlet means for electricity to be converted and outlet means for converted electricity, and being mounted in a radiator housing from which only said inlet means and said outlet means of said assembly communicate with the outside of said housing.

The device of the invention is characterized by the fact that said housing contains at least one fluid in which said assembly of components is immersed, and in that it further includes at least one means for propelling and circulating said fluid in a closed circuit inside said housing.

This converter presents the advantage of being completely leaktight against solid and liquid particles, the housing being completely closed around the electronic converter circuits and their components. Such a converter can thus be used without any risk of being damaged by moisture or dust becoming deposited therein as a result of projections occurring while the vehicles within which such converters are mounted are in use or being maintained.

Furthermore, the cost of such a converter is similar to the cost of a conventionally-cooled converter.

In an advantageous embodiment, the device of the invention also includes, where appropriate, a heat sink between said housing and the components) of said electrical circuit.

Such a heat sink, e.g. constituted by a filled thermally-conductive resin, enables certain electric components to be insulated electrically while removing the heat energy they dissipate directly to the housing, in particular for certain magnetic components with high heat losses such as transformers, thereby further improving the removal of heat to the outside of the converter.

The fluid contained inside the housing of the device is preferably a liquid such as oil, or a gas such as air, suitable for enabling said circuit to operate, said housing being leaktight relative to said fluid around said electric circuit. Although such fluids are known as being poor thermal conductors, they are particularly suited to implementing a converter that is cooled by the method of the invention, with air being preferred since it is free and much simpler to use when making converters.

In a preferred embodiment, said fluid propulsion means comprises at least one propeller coupled to an electric motor connected to said electrical circuit of the device. Such propulsion means may advantageously be constituted by a small fan, with its characteristics and its position inside the converter being selected as a function of the operating characteristics of the converter.

In another preferred embodiment, the device of the invention includes means for channeling said fluid inside said housing. It can readily be understood that such channeling means serve to guide the flow of air or oil inside the housing, thereby improving fluid circulation and also improving the distribution of the heat that is to be removed in contact with the walls of said housing.

In a variant embodiment, said device may also include at least two propulsion means disposed to improve and/or accelerate fluid circulation inside said housing, with housing partition means being positioned at least between said propulsion means.

In order to improve the removal of the heat energy given off by the electric components from the inside towards the outside of the device, it is preferable for the housing to have an inside surface and/or an outside surface that includes heat energy dissipater means, such as fins.

DETAILED DESCRIPTION OF THE INVENTION

Other characteristics of the invention appear on reading the following detailed description with reference to the accompanying drawings which show a preferred embodiment of the apparatus of the invention for implementing the method of the invention, by way of non-limiting example.

The method of the invention applies particularly to cooling battery chargers for electric vehicles of the elevator carriage or pod type, and a particular embodiment thereof is described below.

Figure 2:
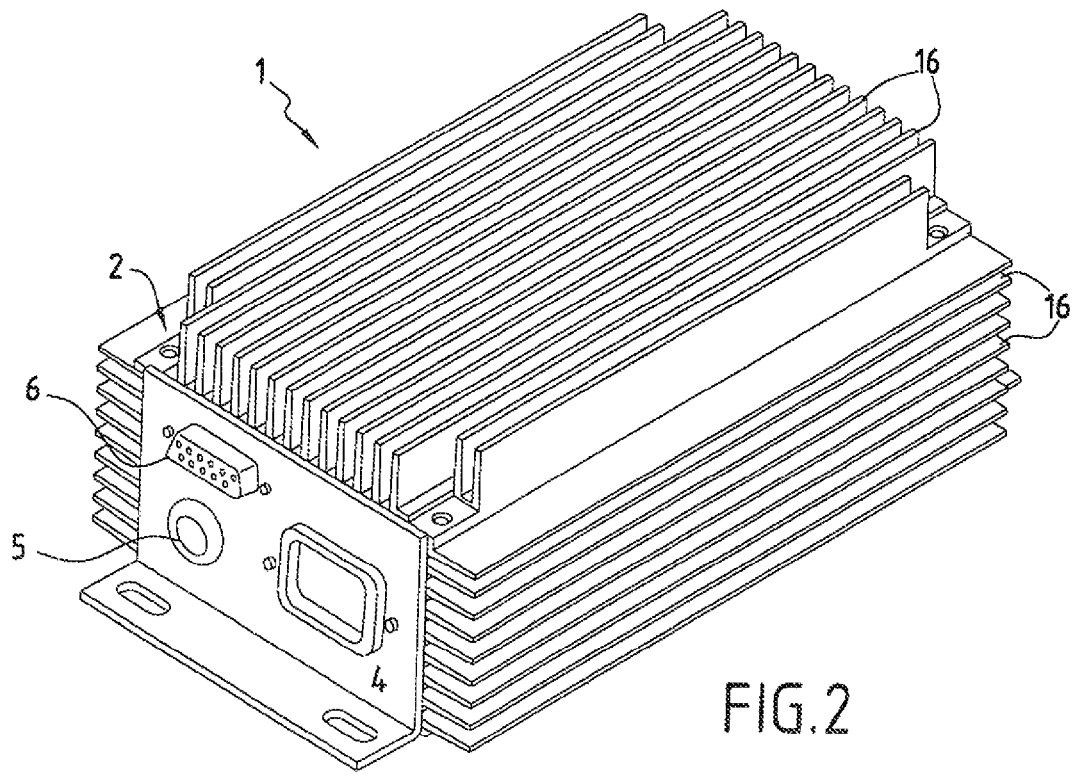
FIG. 2 is a perspective view of a battery charger housing in accordance with the present invention.
Figure 3:
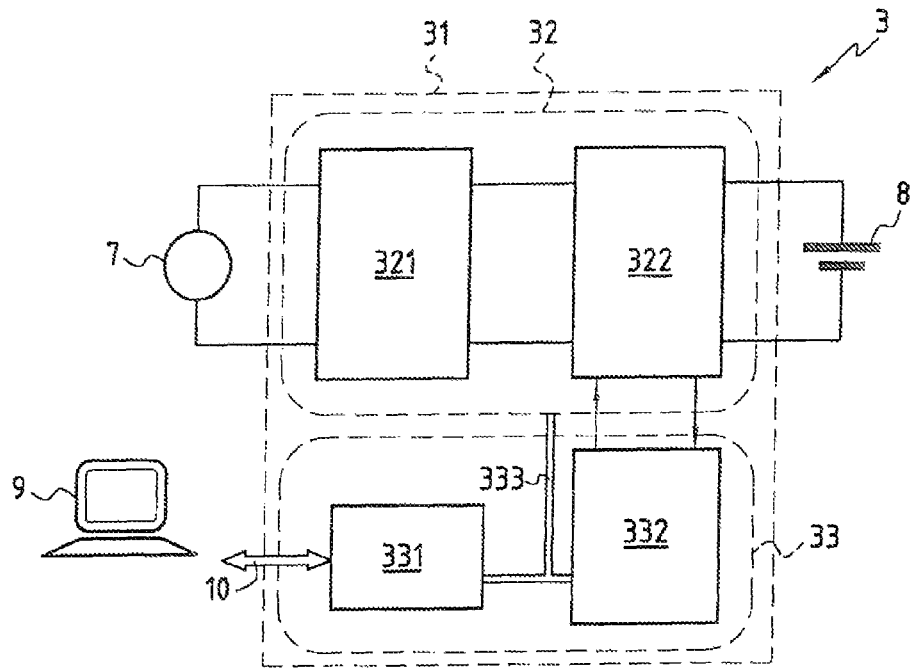
FIG. 3 is a block diagram showing the electronic structure of a battery charger of the type to which the present invention applies.
Figure 4:
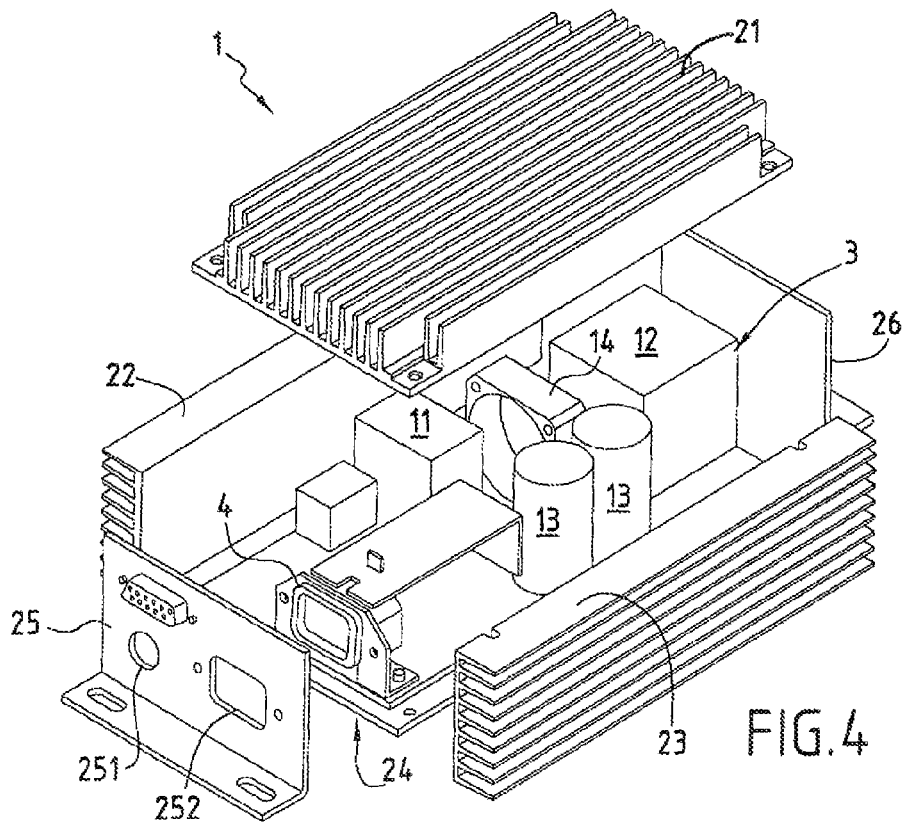
FIG. 4 is an exploded view of a battery charger in accordance with the invention.

Beginning with reference to FIGS. 2 to 4, such a battery charger 1 comprises a static electronic power converter (AC/DC) comprising a metal outer housing 2 enclosing the electronic structure of the converter 3.

The outer housing 2 is made up of rectangular metal plates 21, 22, 23, and 24 forming respectively the bottom, the cover, and the side walls of the housing, these plates being secured to one another by any appropriate means, such as for example welding, or in the example shown screw fastening along the longitudinal ends of each plate. It could equally well be constituted by a tube extruded through a die. End plates 25 and 26 of appropriate dimensions close the openings defined between the other plates at the longitudinal ends of the housing, said end plates including openings 251, 252 cut out therein for passing power supply connectors 4, 5 of the electronic structure enclosed inside the housing, together with at least one connector 6 for communication with a programming system.

Said electronic structure 3, shown as a functional block diagram in FIG. 3 and shown structurally in FIG. 4, is constituted by an electronics card 31 supporting the electronic circuits and components that constitute the electronic power converter of the charger 1.

The converter is of conventional type and may be constituted, for example, by a single-phase rectifier bridge 321 followed by a complete zero voltage switching (ZVS) bridge chopper 322 having its output isolated by a high frequency transformer. The rectifier followed by the chopper constitutes the power stage 32 of the converter, which is suitable for being fed with power from an alternating current (AC) electricity source 7 for delivering at its output direct current (DC) electricity suitable for charging a battery of a vehicle for charging.

As shown in FIG. 3, the electronics card 3 also supports a control stage 33 for controlling the power stage 32, the control stage comprising a memory 331 and a microcontroller 332 for regulating the current and voltage output by the converter, with regulation taking place via a data bus 333 connecting said memory and said microcontroller to said power stage.

This control stage serves in particular to set the operating parameters of the power stage 32 so as to comply with the nominal characteristics concerning the voltage and current delivered by chargers, which, for the charger described, may be 24 volts (V) and 15 amps (A). Nevertheless, other values for nominal voltage and current could equally well be set.

To set these parameters, it suffices to connect said charger 1 to a digital programming system 9 via a control bus 10 connecting said digital system to said control stage via the connector on the housing of the charger. Such means for setting the operating parameters of the charger by means of a digital programming system are known to the person skilled in the art and are therefore not described in greater detail in the present application.

Figure 1:
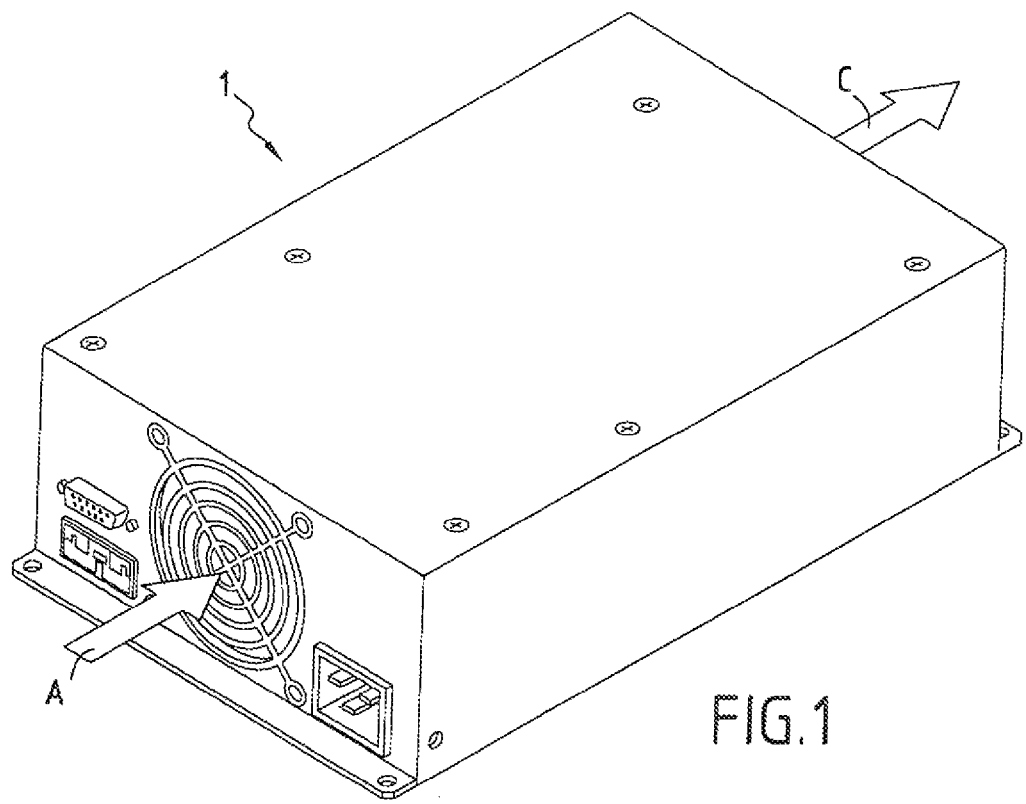
FIG. 1 shows a battery charger known from the prior art.

In accordance with the invention, the entire electronic structure 3 of the charger is confined within its metal housing 2, which housing is completely closed, preferably so as to be proof against any projections of liquid or solid matter that might damage the electronic structure of the converter and degrade or even destroy the charger and prevent it from operating. Such a closed housing serves to increase the protection index of the charger, but it also prevents air from flowing from the outside to the inside of the housing in order to cool the electronic component, as occurs in chargers that are cooled by forced convection, as shown in FIG. 1, so it is only the metal housing of the charger that removes the heat energy given off by the electrical components while the charger is in operation, where this heat energy corresponds to the losses in the charger.

The main components for cooling are passive components such as inductors 11, transformers 12, and capacitors 13, and also active components such as diodes or metal oxide on silicon (MOS) power transistors. In known manner, the active components are preferably placed in direct contact with the housing so as to transmit the heat they give off directly thereto by conduction.

In contrast, the passive components, and in particular the magnetic components (inductors 11, transformers 12, capacitors 13) are not in direct contact therewith. Since these components have high thermal resistance, often greater than 10° C. per watt (°C./W), the temperature rise inside the housing due to the heat being given off by these components while in operation is very considerable, in practice of the order of five to several tens of degrees, and that risks destroying them if they are not cooled.

That is why, in accordance with the invention, the charger 1 has a fan 14 placed inside the closed housing, the fan 14 serving to establish circulation of a stream of air 15 around a closed circuit in contact with the components for cooling and also in contact with the inside walls of the housing.

This stream of air 15 serves to make the distribution of the heat energy given off by said components 11, 12, and 13 uniform within the housing 2, thereby significantly reducing the thermal resistance between the passive components and the walls of the housing, thus enabling the operating temperature of said components to be reduced substantially, by removing the heat they give off by convection via the stream of air flowing round a closed circuit towards the walls of the housing, under drive from the fan 14.

Said housing then acts as a radiator of heat, which is why the outside walls, and where appropriate the inside walls, of the metal plates 21, 22, 23, and 24 forming the housing preferably includes cooling fins 16.

Said fan 14 is positioned on the electronics card 3 supporting the components that are to be cooled, and it is connected to the electrical circuit of said card, and preferably also to the control stage 33 of the converter so as to enable said stage to set the operating parameters of said fan as a function of the operating parameters and structural parameters of the charger. Like said operating parameters of the charger, the operating parameters of the fan are easily programmable and adjustable by means of the above-mentioned digital programming system of the charger.

Depending on the configuration of the electronics card 3 enclosed inside the housing 2 of the charger, and on the space available thereon, several configurations can be envisaged for generating and circulating a stream of air 15 used for cooling the components inside the housing. These various configurations are shown diagrammatically in FIGS. 5 to 8.

Figure 5:
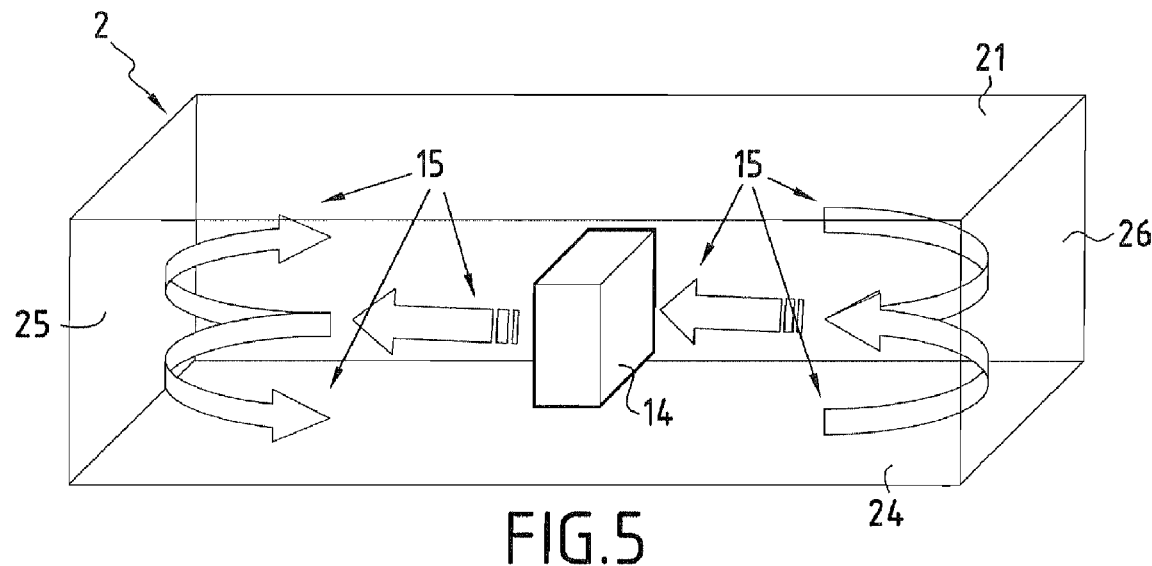
FIG. 5 is a diagrammatic view of a battery charger of the invention in a first embodiment.

Thus, in a first embodiment shown in FIG. 5, the fan 14 can be positioned centrally on the electronics card 31 of the charger so as to generate a central air stream 15 traveling longitudinally inside the housing and spreading over the end plates 25 and 26 and the side walls of the housing, thereby generating forced circulation of air inside the housing by sucking in the air contained in said housing and blowing it against its walls.

Figure 6:
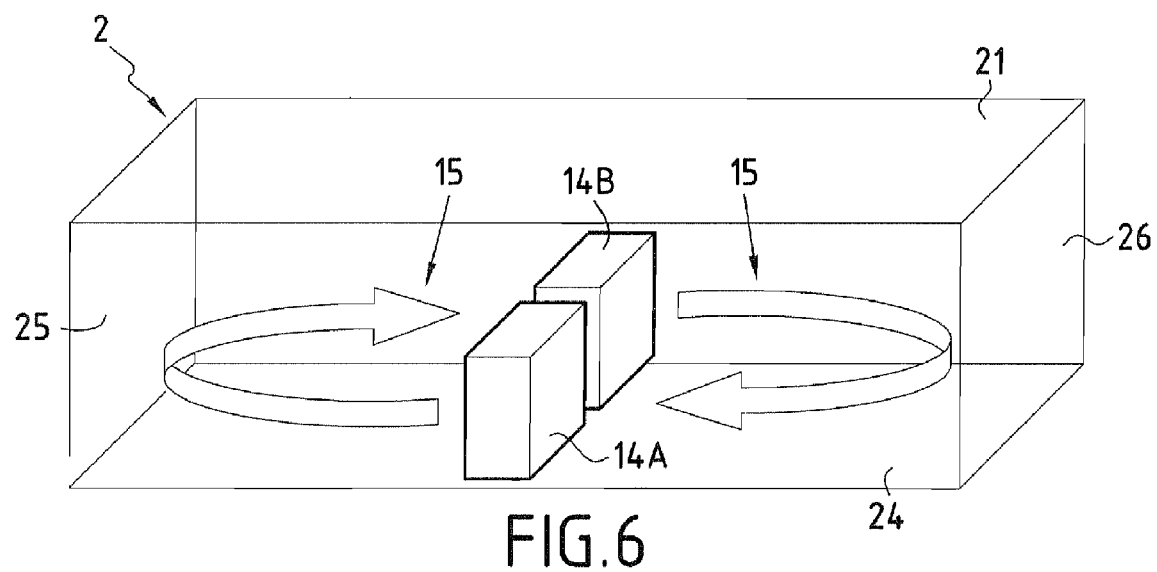
FIG. 6 is a diagrammatic view of a battery charger of the invention in a second embodiment.

In a second embodiment shown in FIG. 6, the air stream 15 inside the housing of the charger can also be driven by means of two fans 14A and 14B disposed substantially in the middle of the electronics card 3 lengthwise, and against its side walls, with the space between the two fans being partitioned by a partition preventing air from flowing between the fans, with the air sucked in and blown out by the first fan 14A being reflected on a first end plate 25 of the housing and then being sucked in and blown out by the second fan 14B, thereby generating a continuous circulation loop that is regular and uniform inside the housing 2.

Figure 7:
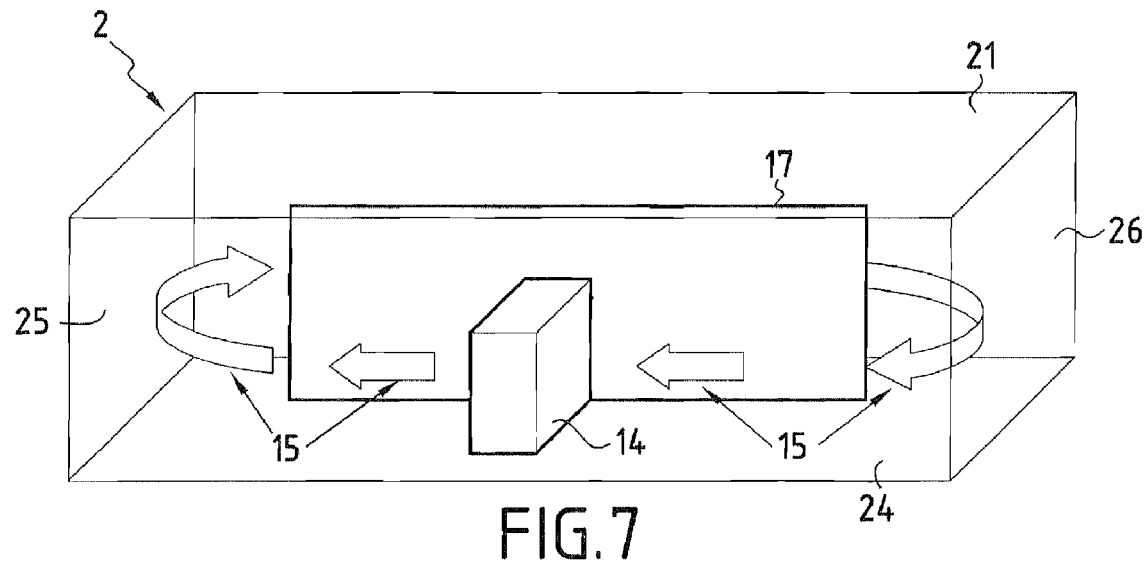
FIG. 7 is a diagrammatic view of a battery charger of the invention in a third embodiment.

In a third configuration also having two fans, as shown in FIG. 7, a partition 17 is placed between the two side fans 14A and 14B, which partition 17 extends longitudinally inside the housing so as to improve guidance of the air stream 15 in contact with the electrical components and also with the walls of the housing. In addition, such a partition serves to generate turbulence in the stream and thus to generate pressure differences between various zones of the housing defined by the partition, with such turbulence and pressure differences improving heat exchange between the air stream and the housing and thus improving dissipation of heat to the outside of the housing.

Figure 8:
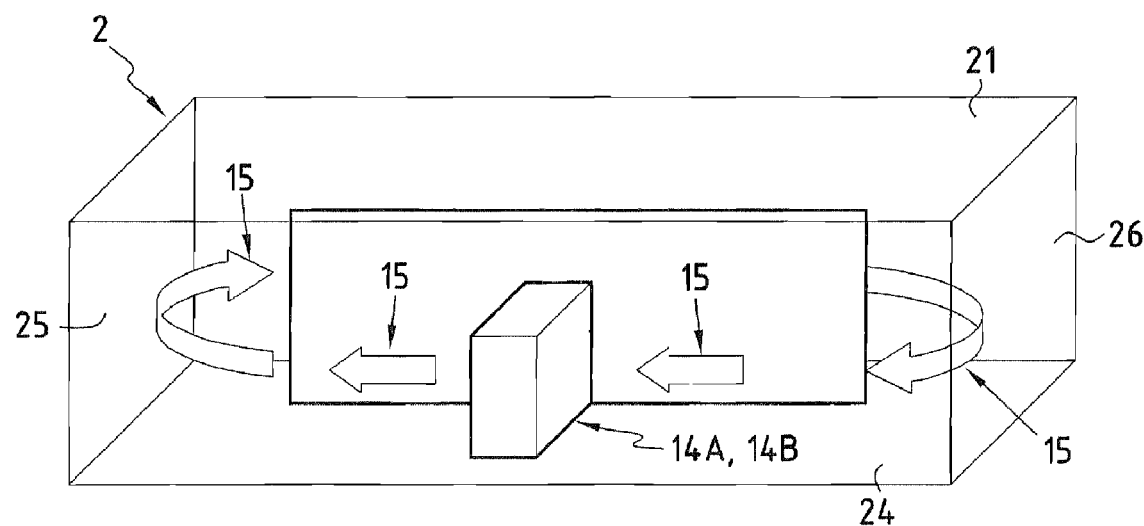
FIG. 8 is a diagrammatic view of a battery charger of the invention in a fourth embodiment.

As shown in FIG. 8, such a longitudinal partition 17 inside the housing can also be envisaged when only one fan 14, located on one side of the electronics card, is used for cooling the various electronic components. Under such circumstances, the speed of the air stream on either side of the partition varies.

In all of the embodiments described above, the various critical parameters for reducing the operating temperature of the passive electronic components are:

the position(s) of the fan(s) 14, 14A, 14B;

the speed of the air stream 15;

the nature and the shape of the inside and outside surfaces of the walls 21, 22, 23, 24, 25, and 26 of the housing; and the position and the shape of the partition 17 when such a partition is present.

The theoretical heat energy given off by the components in operation can be deduced from the known intrinsic characteristics of said components, and from the operating characteristics of the charger, so it suffices subsequently to select the operating parameters of the fan that determine the speed of the air stream, and also the shapes of the walls of the housing, in particular the size and the number of cooling fins, as a function of the heat energy to be extracted from the charger and as a function of constraints set by standards concerning the operation of such chargers and other types of converter, while the positions of the fan and of any partitions are determined by the internal configuration of the housing 2 and by the positioning of the components on the electronics card 31.

For certain thermally critical components such as the transformer 12, it is advantageous also to provide for a heat sink to be placed between such components and the housing 2 in order to remove heat energy to the outside directly by conduction, while still complying with electrical insulation rules. By way of example, such a heat sink may be constituted by a cover made of a filled silicone resin and placed on the coil of the transformer, between said coil and the radiating housing 2 of the charger.

According to another advantageous characteristic of the invention, it is also possible to provide means for dynamically setting the operating parameters of the fan(s) 14, 14A, 14B, and thus the speed at which the air stream circulates. By way of example, such setting means may comprise temperature sensors positioned on the electronics card 3 and connected to the controlling microcontroller 332 of the control stage of the converter, said microcontroller being programmed using a suitable algorithm recorded in the memory 331, to establish a temperature regulation loop inside the housing 2. This regulation loop compares the temperature Tm measured by the sensors with a determined reference temperature To, and where appropriate after making allowance for tolerance values associated with temperature To, causes the propeller of the fan(s) to accelerate or decelerate as a function of the temperature difference measured between To and Tm.

The present invention is described above in terms of particular and non-limiting embodiments and with reference to a particular application that is likewise not limiting on the scope of the present invention, which extends to cooling any type of electronic power converter for which operating conditions can be critical for operation so that they require high protection indices, with cooling being performed by forced circulation of a liquid or gaseous fluid in a closed circuit.

The invention claimed is:

1. A method of cooling a static electronic power converter device comprising at least one electrical circuit comprising an assembly of active components and of passive components interconnected in a manner suitable for performing a determined electrical energy conversion function, said circuit including means for inputting electricity that is to be converted and means for outputting converted electricity and being mounted in a closed leaktight radiator housing with only an inlet and outlet means for inputting electricity and for outputting converted electricity of said circuit communicating between the inside of the housing and the outside, the method being characterized in that the distribution of heat energy given off by said active and passive components is made uniform throughout the inside volume of said housing, and said heat energy is transferred from said radiator housing by forced convection in substantially uniform manner over the entire inside surface of the walls of said housing, by causing at least one fluid contained inside said leaktight housing to circulate in a closed circuit including partition means inside said housing, said circulation of fluid inside said housing being accelerated with at least two propulsion means, said partition means of said housing being positioned at least between said propulsion means.

2. A method according to claim 1, wherein said fluid is channeled relative to said active and passive components and to inside walls of the housing.

3. A method according to claim 1, wherein the circulation speed of the fluid inside the housing is caused to vary as a function of the heat energy given off by said components and/or as a function of the inside volume of said radiator housing.

4. A method according to any one of claims 1, wherein said fluid is caused to circulate between at least two c compartments defined inside said housing.

5. A method according to claim 4, wherein fluid currents are established in said housing, where appropriate in said compartments or between them, in such a manner as to increase the convection of heat energy to the walls of said housing.

6. A device according to claim 1, wherein said fluid propulsion means comprise at least one propeller coupled to an electric motor connected to said electrical circuit of the device.

7. A static electronic power converter device comprising at least one electrical circuit comprising an assembly of active components and of passive components interconnected in a manner suitable for performing a determined electrical energy conversion function, said circuit having inlet means for electricity to be converted and outlet means for converted electricity, and being mounted in a radiator housing from which only said inlet means and said outlet means of said assembly communicate with the outside of said housing, the device being characterized in that said housing contains at least one fluid in which said assembly of components is immersed, and in that it further includes at least one means for propelling and circulating said fluid in a closed circuit inside said housing, wherein, the device includes a partition means inside said housing, said device further includes at least two propulsion means disposed to accelerate the circulation of fluid inside said housing, said partition means of said housing being positioned at least between said propulsion means.

8. A device according to claim 7, wherein said fluid is a liquid such as oil or a gas such as air suitable for enabling said circuit to operate, said housing being leaktight relative to said fluid around said electrical circuit.

9. A device according to claim 7, wherein the inside surface and/or the outside surface of said housing includes heat energy dissipation means such as fins.

\* \* \* \* \*